United States Patent [19]

Howell et al.

[11] Patent Number: 5,781,413
[45] Date of Patent: Jul. 14, 1998

[54] METHOD AND APPARATUS FOR DIRECTING THE INPUT/OUTPUT CONNECTION OF INTEGRATED CIRCUIT CHIP CUBE CONFIGURATIONS

[75] Inventors: Wayne John Howell, Williston, Vt.; John Steven Kresge, Binghamton, N.Y.; David Brian Stone, Owego, N.Y.; James Robert Wilcox, Vestal, N.Y.

[73] Assignee: International Business Machines Corporation, Armonk, N.Y.

[21] Appl. No.: 719,826

[22] Filed: Sep. 30, 1996

[51] Int. Cl.⁶ .................................................. H05K 7/02
[52] U.S. Cl. .................... 361/777; 361/736; 361/768; 361/790; 361/803; 174/261; 257/686; 438/109
[58] Field of Search ................... 361/735, 736, 361/767, 768, 777, 778, 790, 803; 439/68, 69, 71; 257/686, 777; 174/260, 261; 438/109

[56] References Cited

U.S. PATENT DOCUMENTS

| | | | |
|---|---|---|---|
| 4,574,331 | 3/1986 | Smolley | 361/735 |
| 4,727,410 | 2/1988 | Higgins, III | 257/700 |
| 4,813,129 | 3/1989 | Karnezos | 29/832 |
| 5,007,841 | 4/1991 | Smolley | 439/66 |
| 5,016,138 | 5/1991 | Woodman | 361/688 |
| 5,051,865 | 9/1991 | Kato | 257/686 |
| 5,177,594 | 1/1993 | Chance et al. | 257/678 |
| 5,224,918 | 7/1993 | Neumann et al. | 29/885 |
| 5,252,857 | 10/1993 | Kane et al. | 257/686 |
| 5,281,852 | 1/1994 | Normington | 257/686 |
| 5,311,401 | 5/1994 | Gates, Jr. et al. | 361/760 |
| 5,327,327 | 7/1994 | Frew et al. | 361/784 |
| 5,343,075 | 8/1994 | Nishino | 257/686 |
| 5,406,565 | 4/1995 | MacDonald | 371/10.3 |
| 5,414,637 | 5/1995 | Bertin et al. | 364/489 |
| 5,432,729 | 7/1995 | Carson et al. | 257/686 |
| 5,434,745 | 7/1995 | Shokrogozar et al. | 361/735 |
| 5,502,333 | 3/1996 | Bertin et al. | 257/686 |
| 5,561,593 | 10/1996 | Rotolante | 361/790 |
| 5,686,843 | 11/1997 | Beilstein, Jr. et al. | 324/758 |
| 5,691,041 | 11/1997 | Frankeny et al. | 439/71 |

OTHER PUBLICATIONS

"Silicon Cube Burn–In Methodology," K.E. Beilstein, et al., IBM Technical Disclosure Bulletin, vol. 37, No. 07, Jul., 1994.

*Primary Examiner*—Leo P. Picard
*Assistant Examiner*—John B. Vigushin
*Attorney, Agent, or Firm*—Calfee, Halter & Griswold LLP

[57] ABSTRACT

A technique is disclosed for forming a chip cube from a plurality of chips laminated together in front-to-back relationship, the edges of the chip forming a cube face having a set of connectors for each chip thereon. A number "X" of functional chips is required for the operation, and "X+Y" is the number of chips provided in the stack such that there is Y number of chips greater than the number of functional chips required. If any number of chips equal to Y or less are found to be defective, there are enough chips remaining to perform the required function. Thereafter X number of good chips are connected to output circuitry through an interposer. Electrical connectors are provided on all of the IC chips. Contact pads for all of the connectors are provided on one face, and outlet pads are provided on the opposite face of the interposer for at least Y number of outlets. The interposer has vias at least equal to the number of outlet pads. After assembly, the chips are burnt-in, and if there are enough functional chips after burn-in, the interposer is wired to connect X number of sets of chip pads and the outlet pads through the vias. The chip stack is mounted on the interposer wherein all of the connectors on the cube face are connected to all of the chip mounting pads, but only those which have been selected for functioning chips are connected through the vias to the outlet pads.

8 Claims, 5 Drawing Sheets

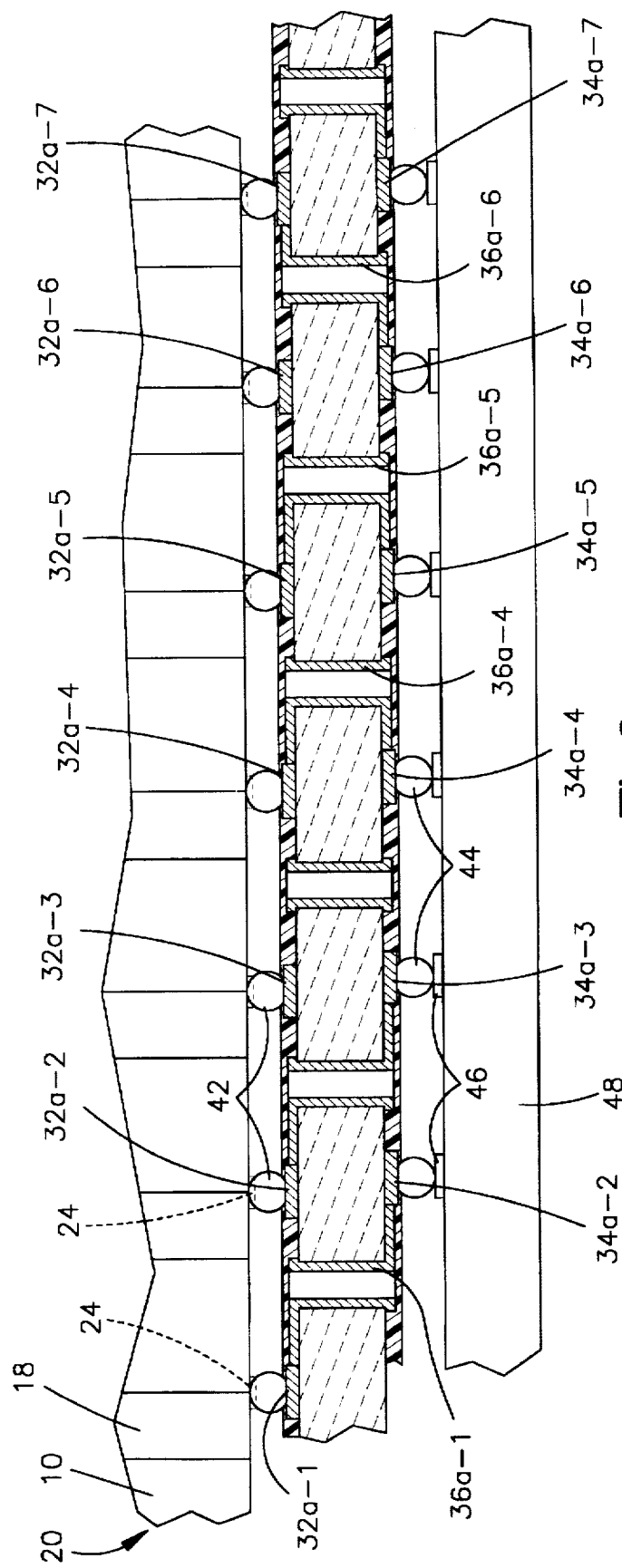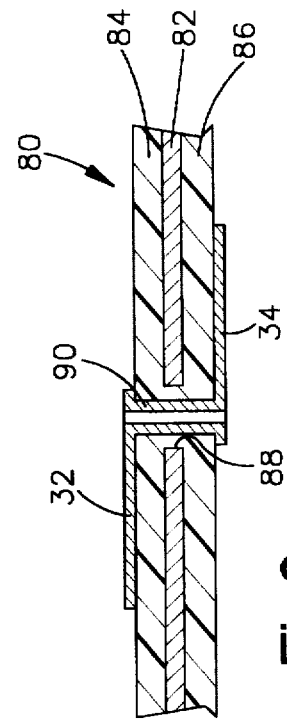
Fig.8
Fig.9

METHOD AND APPARATUS FOR DIRECTING THE INPUT/OUTPUT CONNECTION OF INTEGRATED CIRCUIT CHIP CUBE CONFIGURATIONS

RELATED APPLICATION

Application Ser. No. 08/722,717, filed concurrently herewith, entitled "Method and Apparatus for Redirecting Certain Input/Output Connection of an Integrated Circuit Chip Configurations." (Attorney Docket No. EN9-96-074).

1. Field of the Invention

This invention relates generally to the packaging of integrated circuit (IC) chips, and more particularly to the packaging of IC chips in a so-called chip cube or stacked configuration. In more particular aspects of this embodiment, this invention relates to a technique for providing a chip cube or stacked structure which allows for sparing of chips to assure that there are sufficient chips and connections therefor for providing a fully operative chip cube or stacked structure.

2. Background Art

In the packaging of IC chips, and particularly memory chips, one technique that is used is forming the so-called "chip cube" or "chip stack." In this technique, a series of IC chips is provided, each of which chips has outputs on the face thereof which outputs are brought to one edge of each of the chip. The chips are then joined in a front-to-back relationship in such a manner that the edges of the chips which have the electrical contacts or leads terminating thereon form one face of the chip "cube" or "stack". (It should be understood that the term "chip cube" is not limited to a solid shape that is cubical having six square faces, but can refer to other solid parallelpipeds where the faces are rectangular or, indeed, other parallelograms.)

The chip cube is then mounted on some type of a substrate by solder ball or other suitable connections between the exposed contacts on the cube face and pads on the substrate. In such a case, the input/output pads on each chip are arranged in sets so that each set of inputs and outputs to any given chip are similarly arranged to the sets of inputs and outputs of any other chip. Thus, a compact structure of IC chips, especially memory chips, is provided which, when mounted onto a substrate, provides a high density memory structure.

One of the problems encountered, however, is that even though all of the chips utilized to form the cube or stack have been tested as "good" chips, nevertheless, once the chips have been formed into the stack, additional stressing (i.e., burn-in) of the chips may result in chip electrical functionality failure. The burn-in procedure is a procedure wherein the chips, once assembled, are exercised at elevated temperatures and/or voltages which will induce chips to fail, which chips would otherwise be prone to early failure. This burn-in procedure also will detect any problems created by adding the additional circuitry to bring the leads of the chips out to the edge and the bonding and other assembly operations for forming the chip cube. Hence, it is not uncommon for one or more chips to fail during this burn-in procedure. If in the chip cube or chip stack there are merely the exact number of chips for the part as required for functioning, the failure of any one chip can result in the failure of the entire part. Because of the nature of the joining of the chips together, reworking is generally not a viable option, and thus the entire stack of chips would have to be discarded if even just one of the chips were inoperative or had failed.

To overcome this problem, a technique known as "sparing" has been adopted in which more than the required number of chips are formed into the chip stack and, after burn-in when the functioning chips and the failed chips have been identified, the number of functioning chips required can be custom-wired to provide the necessary connections. This technique, however, has not proved entirely satisfactory since most of the custom-wiring techniques have required very thin line circuit traces being formed on a face of the chip cube or, alternatively, on layers of dielectric formed over the chip cube face to form the connection. By forming a layer of dielectric on the chip cube face, thin film polyimide edge beading and other problems have contributed to a significant problem in providing the required wiring.

SUMMARY OF THE INVENTION

According to the present invention, a technique is provided for forming a chip cube or stack made up of a plurality of chips laminated together in front-to-back relationship with the edges of the chips forming a cube face having a set of connectors for each chip thereon. The number of functional chips required for operation is defined as X and the number of chips provided in the stack is equal to X+Y where X and Y are whole number integers such that there is a selected number of chips greater than the number of functioning chips required in the stack. If any number of the chips equal to Y or less are found to be defective as a result of burn-in, there are still enough of the remaining chips available to perform the required function of the stack. Thereafter, X number of the good chips are connected to output circuitry through an interposer. The interposer is provided with contact pads for each set of contacts on all of the IC chips (X+Y) on one side of the interposer, and outlet pads are provided on the opposite side of the interposer, there being X sets of outlet pads. Also provided in the interposer is a number of sets of vias at least equal to the number of outlet pads. The chips are all exercised in a burn-in procedure after they have been assembled into a chip stack. If there are sufficient number of functioning chips after burn-in, the interposer is custom-wired to connect X number of sets of chip pads and the outlet pads through the vias. The chip stack is then mounted on the interposer, preferably by solder ball connection technology wherein all of the contacts on the cube face are connected to all of the chip mounting pads on the interposer, but only those which have been selected for functioning chips are connected through the vias and the outlet pads to provide input/output capabilities for the chip stack.

DESCRIPTION OF THE DRAWINGS

FIG. 8 is a sectional view taken through a portion of an interposer and portions of the chip stack showing a technique of chip shifting to provide connection; and FIG. 9 is a longitudinal sectional view of a portion of another embodiment of an interposer.

DESCRIPTION OF THE PREFERRED EMBODIMENT(S)

Figure 1:
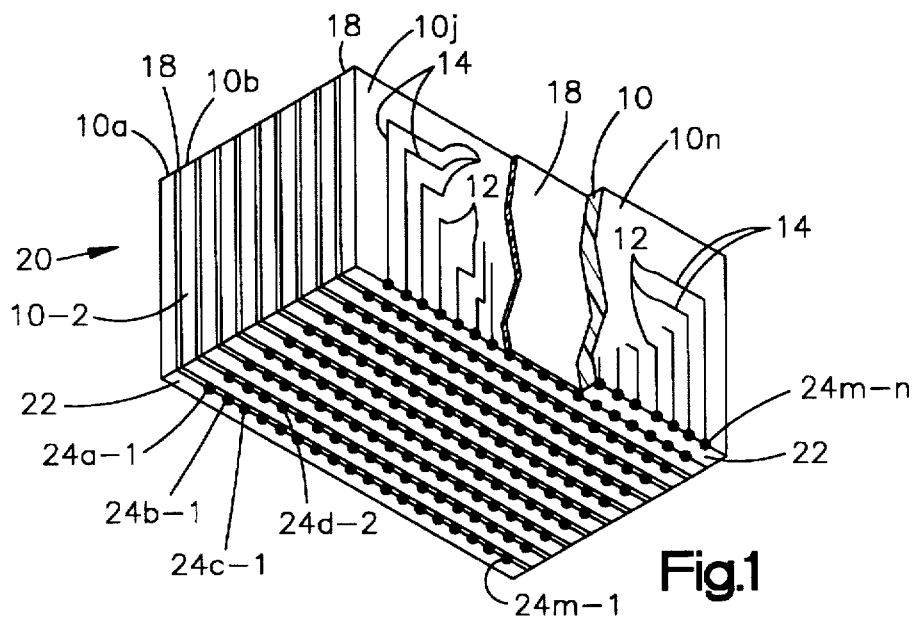
FIG. 1 is a perspective view of several IC chips forming a stack according to this invention.

Referring now to the drawings, and for the present to FIG. 1, a perspective view of a portion of a chip cube is shown partially in section with parts broken away for clarity. In essence, the chip cube is formed of a plurality of integrated circuit chips 10, each of which is formed with a conventional footprint comprised of a plurality of input/output (I/O) connections 12 thereon. (To distinguish between various chips, a numbering convention has been adopted to refer, when necessary, to specific chips as 10-1, 10-2 ... 10-n, "n" designating the last number in the series.) The I/O connections 12 have circuit lines 14 leading therefrom to one edge of the chip 10. The chips 10 are secured together in front-to-back relationship by means of thin films of adhesive 18 which form the chips generally into a stack or cube. The chips 10-1 through 10-n are arranged so that the circuitry 14 terminates at a connector surface 22 on the cube 20, at which the circuitry 14 terminates and forms an array of connections 24 thereon. To designate the various connections on a given chip 10, the connections are designated as 24a, 24b, ... 24m (in this case, "m" designates an end number in a series). Thus, a given connection or a particular chip would be designated, e.g., connection 24a-1, or 24b-3, etc. As was indicated earlier, all of the chips 10-1 to 10-n are tested prior to formation into the cube 20, but the chips are not burned in until after they are formed into the cube 20. When the chips are burned in, one or more of the chips may fail; i.e., one or more of the connections 24a-24m on any one chip 10 may fail to perform during testing. If the cube were arranged to include just enough chips to satisfy the connection requirements to a substrate, as will be explained presently, and one of the chips failed or indeed one connection 24 on one chip 10 failed, the entire cube would be inoperative and would have to be scrapped since typically every connection is required to operate. Therefore, it is common practice to provide more chips in the cube than are necessary to form the connections. For example, and just by way of example and not by limitation, it may be necessary to utilize 20 operative or functioning chips to provide the necessary connections to form a chip cube. In such case, and to ensure that after burn-in there is a high probability of there being at least 20 operative chips, an excess number of chips are bonded to form the cube, e.g., twenty-four chips could be used and bonded to form the cube, from which, in all probability, at least twenty chips 10 would be good. The challenge, then, is to provide an outlet or external connection to the cube after burn-in that will provide the necessary connection to the substrate which will be common to the substrate irrespective of which twenty chips are functional and functioning, and irrespective of which chips, if any, fail, and which external connection will have a common pattern of outlets required. At this point, it should be noted that each of the chips is substantially identical in construction, and the chips are completely interchangeable, one with the other; i.e., any twenty chips can be used, and any one chip can substitute for any other chip.

Figure 2:
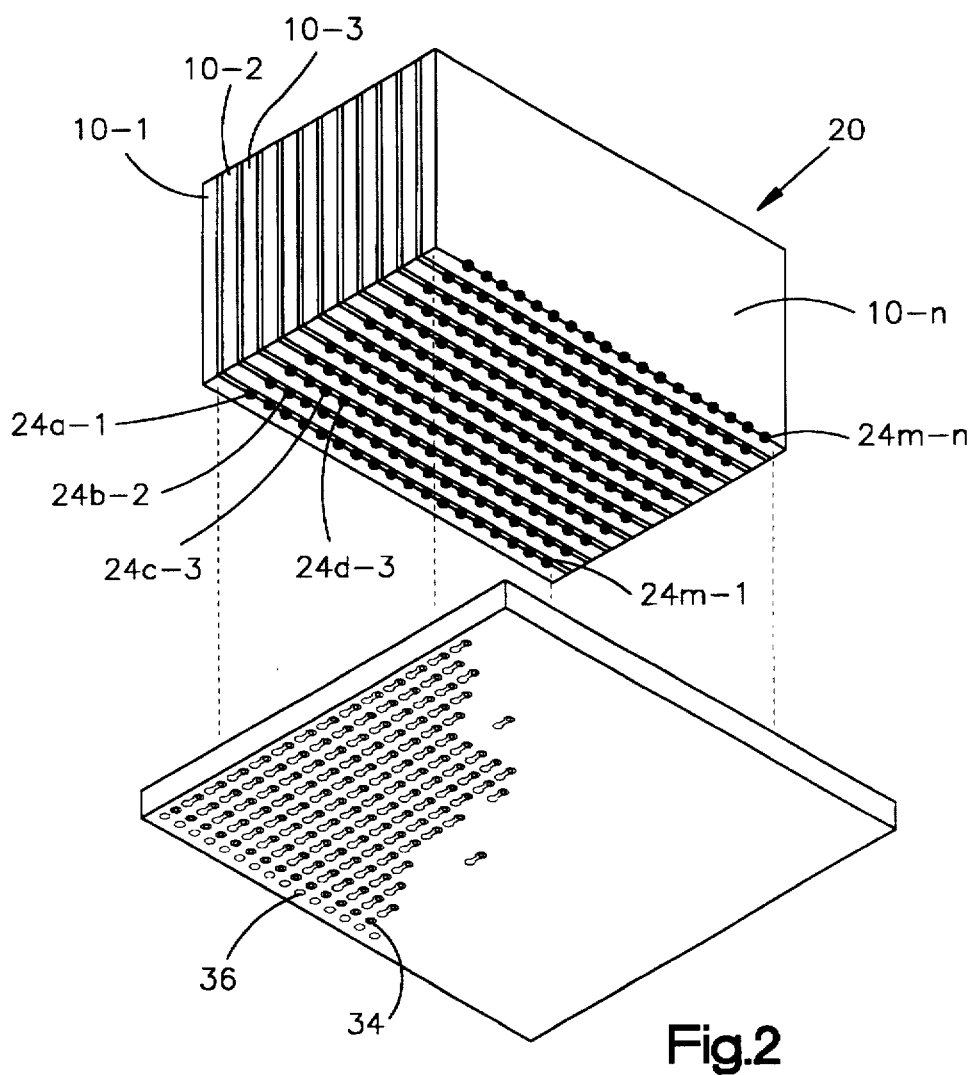
FIG. 2 is an exploded view of the chip stack and interposer according to this invention.
Figure 3:
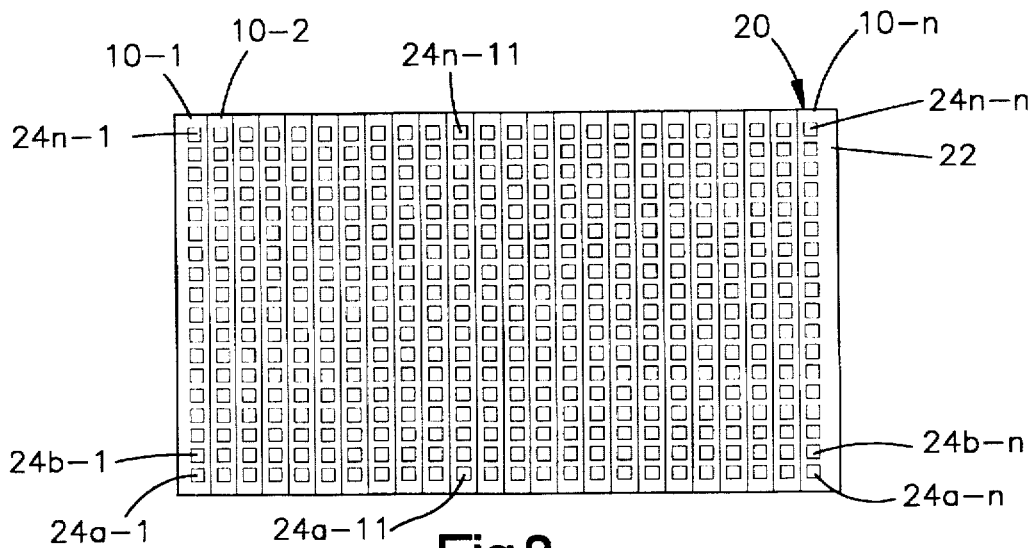
FIG. 3 is a bottom plan view of the face of the chip cube having the chip contacts thereon.
Figure 4:
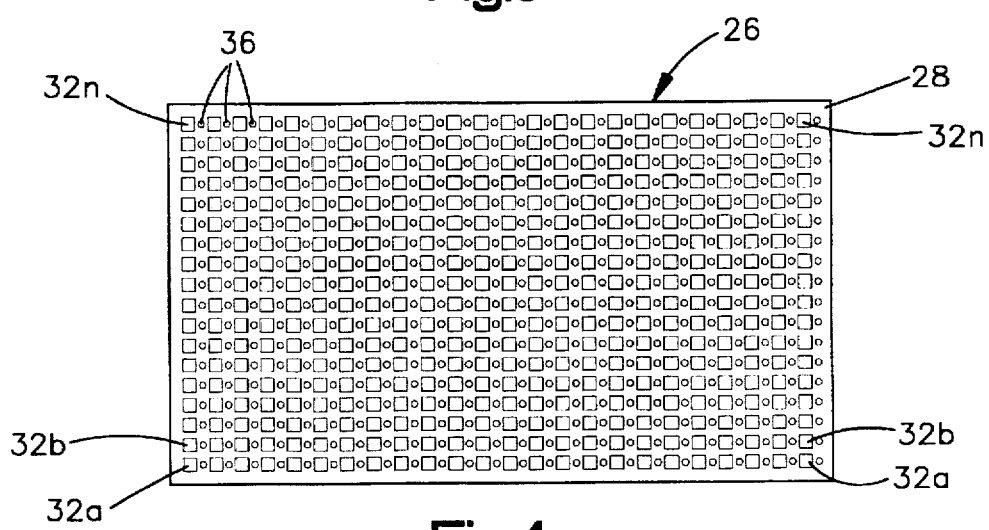
FIG. 4 is an X-ray top plan view of the cube mounting face of an interposer for use in connecting IC chips.
Figure 5:
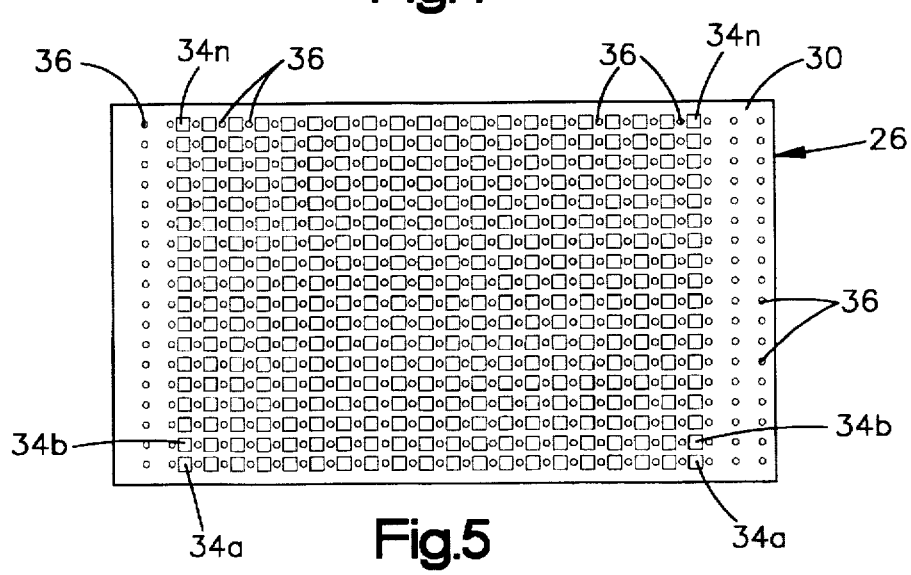
FIG. 5 is a bottom plan view of the output face of the interposer of FIG. 4.

In order to accomplish this purpose of allowing any of the twenty of the twenty-four chips 10 to function, an interposer 26 is provided which is formed of a dielectric material such as composite reinforced polytetrafluoroethylene (PTFE) or polyimide. As shown in FIGS. 2, 4 and 5, the interposer has a cube mounting surface 28 and an output surface 30. The cube mounting surface 28 has an array of chip attachment pads 32 thereon, which correspond in number and location to the connector pads 24 on the face 22 of the cube 20. Thus, there is provided on the cube mounting surface 28 of the interposer 26 a number of pads which are located so that all of the connectors 24a–24m on all of the chips 10-1 through 10-n can be connected to the chip attachment pads 32; i.e., the pads 24a–24m of each of the twenty-four chips 10-1 through 10-24 has a corresponding attachment pad 32a–32m on the surface 28 of the interposer 26.

The output surface 30 of the interposer 26 is provided with a series of output pads 34a–34m, which correspond in location and number to the number of connections which need to be made; i.e., if twenty chips are to be functional, there will be twenty sets of pads 34a–34m. As indicated above, these pads 34a–34m will correspond in location and number to the number of connections required for the I/Os of the cube in its functional environment. It then becomes necessary to identify the functioning chips in the cube. There must be enough functioning chips in the cube to meet the requirements of all of the I/O pads 34a–34m. In the example used, there must be twenty functioning chips, or expressed another way, there can be no more than 4 non-functioning chips. In a more general sense, this can be expressed as a chip array or cube having X+Y number of chips wherein X and Y are positive integers and wherein there must be at least X number of functioning chips (i.e., a chip where all connections 24a–24m of the chip work). Thus, as indicated in the example chosen, there must be at least twenty functioning chips, and hence, no more than four non-functioning chips.

Assuming that there are at least enough functioning chips to fulfill the requirement of X functioning chips, which in the case being described is that there are at least twenty functioning chips, the interposer is then wired to connect a selected twenty functioning chips to the twenty rows of chip output pads 34a–34m on the output surface 30. This is done by means of wiring the chip attachments pads 32a–32m to the output pads 34a–34m through vias 36 formed in the interposer, each of the vias extending from the chip mounting surface 28 to the output surface 30. These vias 36 are preferably in the form of plated through holes, and thus surface wiring on either the output surface 30 or the cube mounting surface 28, or both, can be used to attach the connection 24a–24m of each of the functioning chips to the output pads 34a–34m.

Figure 6:
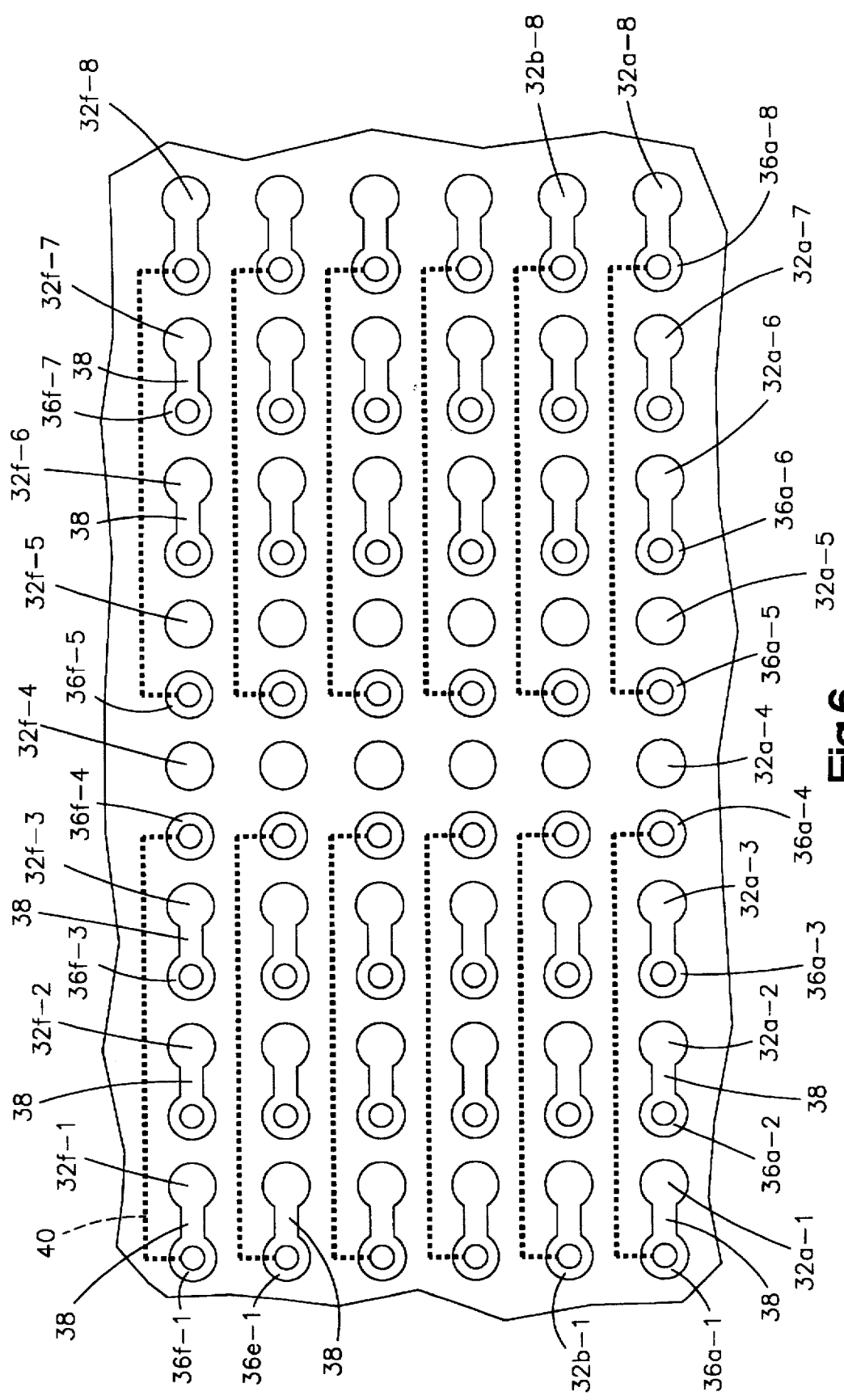
FIG. 6 is a top plan view of a portion of the cube mounting face of the interposer showing customized electrical connections.
Figure 7:
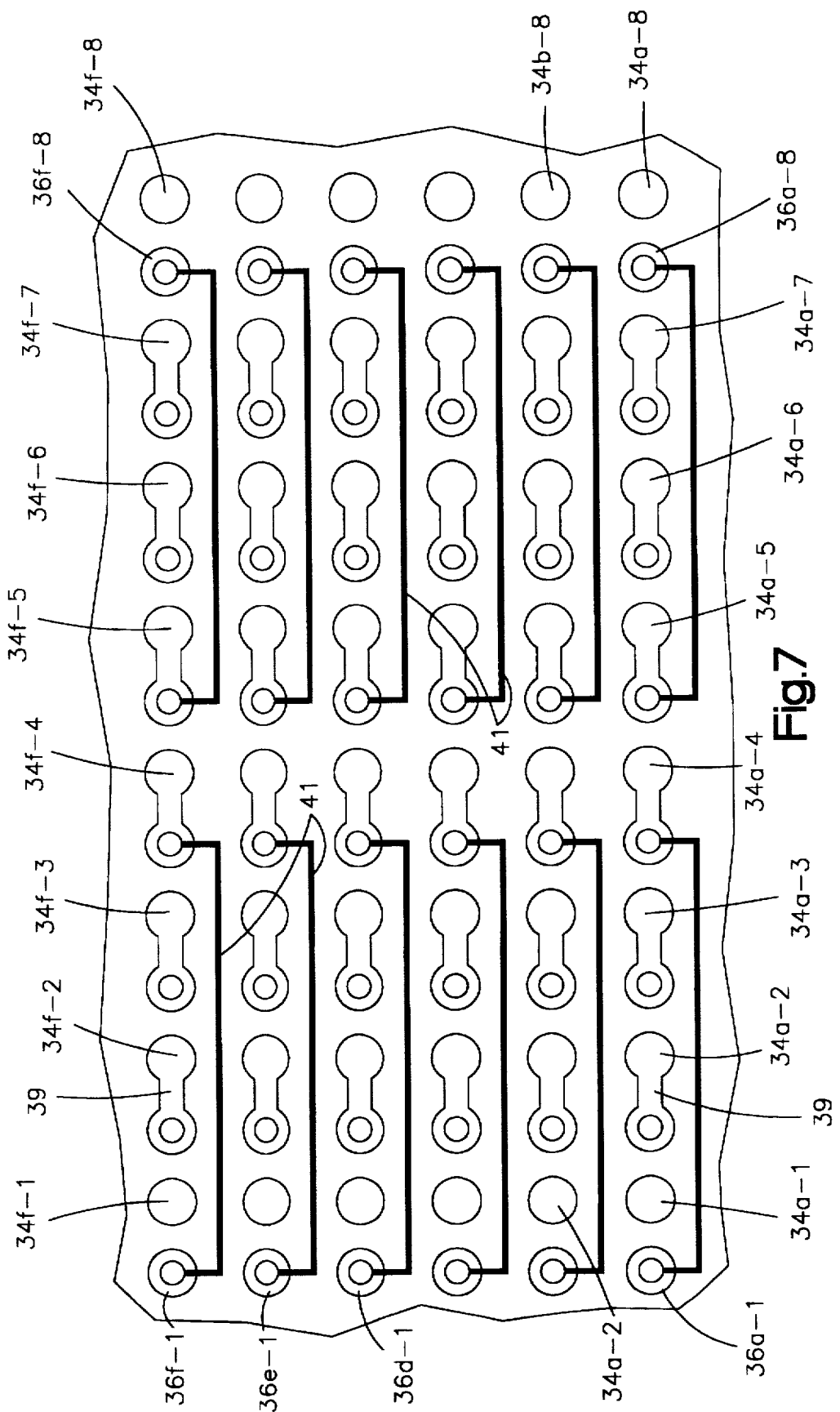
FIG. 7 is an X-ray bottom plan view of a portion of the interposer showing custom circuitization.

One technique for wiring the chips is shown in FIGS. 6 and 7. In this technique, the top and bottom surfaces of the interposer 20 are used as wiring channels to selectively wire the selected functioning chips to the output pads 34a–34m on the bottom surface of the interposer. (It is to be understood that FIGS. 6 and 7 are somewhat schematic and show somewhat diagrammatically the technique of wiring just a few chips of the array, it being understood that this technique applies to all of the chips and all connection sites on each chip.) In this case, it is desired to wire the chip which is bonded to the pads 32a-1 through 32m-1 to outlet pads 34a-4 to 34m-4, and to wire the chip attached to the pads 32a-8 through 32m-8 to outlet pads 34a-5 to 34m-5; the chips attached to 32a-2 to 32m-2 are wired to pads 34a-2 to 34m-2; the chips connected to pads 32a-3 to 32m-3 are wired to pads 34a-3 to 34m-3; the chips wired to 32a-6 through 32m-6 are wired to pads 34a-6 to 34m-6; and chips attached to pads 32a-7 through 32m-7 are wired to pads 34a-7 to 34m-7. In this scheme, the chips attached to pads 32a-4 through 32m-4 and 32a-5 through 32m-5 have been "deselected." i.e., due to some defect or other reason, they are not functioning chips, even though they are to be connected to their respected pads 32a-4 to 32m-4 and 32a-5 through 32m-5. In this scheme, each of the pads 32a-1 to 32m-1, 32a-2 to 32m-2, 32a-3 to 32m-3, 32a-6 to 32m-6 and 32a-7 to 32m-7 are connected by circuit traces 38 to their next adjacent via 36 as seen in FIG. 6. Similarly, the pads 34a-2 to 34m-2, 34a-3 to 34m-3, 34a-4 to 34m-4, 34a-5 to 34m-5, 34a-6 to 34m-6, and 34a-7 to 34m-7 are also connected to their next adjacent vias 36 by circuit traces 39 on the bottom. By the wiring on the surface 28 of the interposer 20, the pads 32a-1 through 32m-1 are connected to their adjacent vias 36, which in turn are connected to vias 36 by surface wiring 40 on surface 28, and which vias 36 on the bottom surface 30 are connected to pads 34a-4 through 34m-4 by traces 39. Thus, this effectively connects the chip that is connected to the pads 32a-1 through 32m-1 around some pads to the pads 34a-4 through 34m-4 for output. Similarly, the chip connected to pads 32a-8 through 32m-8 is connected through via 36 adjacent thereto to the vias on the bottom adjacent to pads 34a-5 through 34m-5 by surface wiring 41 on surface 30, thus effectively connecting the chips that are connected to the pads 32a-8 through 32m-8 to the pads 34a-5 through 34m-5. Thus, the chip footprint connected on the bottom represents pads 34a-2 through 34m-2, 34a-3 through 34m-3, 34a-4 through 34m-4, 34a-5 through 34m-5, 34a-6 through 34m-6 and 34a-7 through 34m-7. These are the pads then that are soldered by solder ball connection 44 (see FIG. 8) or otherwise joined to a substrate to form the connection to the chips, which chips are soldered or otherwise connected to the pads 32. Hence, irrespective of which chips are functional that are attached to pads 32 by providing circuitry using the channels on the surfaces 28 and 30 of the interposer, appropriate wiring can be provided to connect any chip in the array of good chips to provide the required output to the pads below. Thus, if there is an array of twenty-four chips and twenty good chips are required, any twenty good chips will suffice to provide the same output footprint on the pads 34 irrespective of which twenty chips are functional.

FIG. 8 is a sectional view through connections 32a-1, 32a-2, 32a-3, 32a-4, 32a-5, 32a-6 and 32a-7 and pads 34a-1, 34a-2, 34a-3, 34a-4, 34a-5, 34a-6 and 34a-7 in connecting a chip stack 20 to a substrate utilizing a technique known as chip shifting. Wiring in the channel is not required in this technique. This also depicts the connection of the chip cube 20 to the pads 32 by means of solder balls 42 and the connection of the pads 34 by solder balls 44 to pads 46 on a substrate 48. In this case, pad 32a-1 is connected through via 36a-1 to pad 34a-2; pad 32a-2 is connected through via 36a-2 to pad 34a-3; pad 32a-3 is not connected to any pad; pad 32a-4 is connected through via 36a-4 to pad 34a-4; pad 32a-5 is connected through via 36a-5 to pad 34a-5; pad 32a-6 is not connected to any pad; and pad 32a-7 is connected through via 36a-6 to pad 34a-6. Thus, the result is chip shifting, wherein a chip can be connected to a pad directly beneath or within one of the pads. With the technique shown in FIG. 8, the connection of the chips can be shifted one position either left or right without the need to use any channels on the surface of the interposer for wiring. Chip shifting can be used instead of or in combination with the surface wiring as shown in FIGS. 6 and 7.

It will thus be appreciated with the embodiments of the invention shown in FIGS. 1–8 once a chip stack 20 has been formed, the chips tested, and it determined that there are a sufficient number of functioning chips available, the interposer can be custom-wired to connect with those functioning chips, wherever they are located in the stack, and provide the necessary footprint on the output. To this end, the interposer could be partially formed and maintained in stock, i.e., the pads 32 and 34 on both sides and the vias 36 formed in the interposer without connections using standard photolithographic and metalization processing. Once the pattern of functioning chips has been determined, the necessary connections can be formed, again using standard photolithographic techniques. Alternatively, the interposer can be formed starting with the dielectric material as a blank and forming all of the pads, vias and interconnections after the determination has been made as to which chips are to be functional and which chips are non-functional chips. In this way, the entire stack of chips need not be scrapped due to the lack of functioning of a single connection. A standard footprint can be used, and only a single part or a very limited number of parts need be stored through the interposer, with the customization being done quickly and rapidly once the determination has been made as to which chips are functional in the stack.

Another alternative is that the interposer can be formed with all of the holes drilled, and plated with copper, and all circuit-receiving surfaces blanket plated with copper. After the determination of which chips are to be used as good chips, the required pads and interconnections are defined by subtractive etching. Both additive and subtractive circuitization as described require custom art work.

Another technology that can be used is laser direct write lithography to customize the part by either additive or substractive processes.

Referring now to FIG. 9, a longitudinal sectional view of a portion of another embodiment of an interposer according to this invention is shown. This embodiment is particularly useful to accommodate differences in the coefficient of thermal expansion (CTE) of components. In particular, it is useful in accommodating the differences in the CTE of a chip stack in different directions; i.e., in the direction transverse to the chip in the stack as compared to the direction longitudinal to the chips, which, as is well known, is different. The interposer designated by the reference character 80 is comprised of a sheet of metal 82 laminated between a pair of silica filled polytetrafluoroethylene (PTFE) sheets 84, 86. Holes 88 are pre-formed in the plate 82 where vias 90 are to be formed. The lamination of the sheets 84 and 86 under heat and pressure causes the PTFE material therefrom to fill the holes 88 during lamination. The vias 90 are then formed, and the interposer circuitized, including top surface metallurgy 32, bottom surface metallurgy 34, and plated through holes 36 are formed in a conventional manner. The metal sheet 82 is selected such that it, together with the PTFE material, provides a composite CTE of the desired value. For example, the metal could be copper, or invar or copper-clad invar (CIC). Typically, the composite CTE of the interposer 80 is selected to be about 10 ppm/°C. for a chip stack, although other values could be selected depending upon well-known design considerations.

Other techniques of controlling the CTE can be used, such as the selection of the dielectric material for the interposer, either with or without the use of a metal sheet.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. An IC chip assembly comprising
   an array of IC chips stacked in front-to-back relationship to form a cube of chips with one side of each of said chips together forming a connection face of said cube,
   each of said chips having a set of electrical connectors arranged in a given pattern on said connection face of said cube, and wherein there are X+Y number of chips in said array, wherein X and Y are integers, and wherein there is at least X number of functioning chips,
   a dielectric interposer having a cube mounting face and an output face, said output face having X number of sets of output pads formed thereon, said interposer having at least X number of conducting vias extending therethrough, said cube mounting face of said interposer having X+Y number of sets of attachment pads positioned to correspond to said connectors on said cube face,
   each of said connections of each set on said cube face being connected to a corresponding attachment pad on said cube mounting face of said interposer,
   a first set of electrical connections on said cube mounting face connecting each attachment pad of each set of contacts corresponding to the electrical conductors of said X number of functioning chips to a set of vias,
   a second set of electrical connections on said output face connecting said output pads to said set of vias,
   whereby any set of X number of functioning chips provide the output to said X number of sets of output pads.

2. The structure of claim 1 wherein the electrical connections on at least one face extend around at least some pads.

3. The structure as defined in claim 1 wherein the electrical connection on said faces extends from a contact to an adjacent via.

4. The structure as defined in claim 1 wherein said interposer is a laminated structure having different materials forming the laminate whereby to control the coefficient of thermal expansion.

5. The structure as defined in claim 4 wherein said laminate structure is a dielectric material having a metal sheet disposed therein.

6. A method of providing connections between an array of IC chips stacked in front-to-back relationship to form a cube of chips with one side of each of said chips together forming a connection face of said cube, and wherein each of said chips has a set of electrical connectors arranged in a given pattern on said connection face of said cube, and wherein there are X+Y number of IC chips in said array, wherein X and Y are integers and wherein there are at least X number of functioning chips, and wherein there are X number of sets of chip electrical connections required for output; comprising the steps of:

providing an interposer formed of a dielectric material and having a cube mounting surface and an output surface, providing an array of X number of output pads on said output surface, providing at least X number of electrically conducting vias extending from said cube mounting surface to said output surface, providing X+Y number of sets of attachment pads on said cube mounting surface corresponding in location to the sets of connectors on said cube face, determining which of said chips are functioning chips and which are non-functioning chips, if the number of functioning chips is equal to or greater than X, then forming electrical connection between X number of sets of the attachment pads on said cube mounting surface of said interposer and said output pads on the output surface through said vias, connecting all of said electrical connectors on said connection face of said cube to the corresponding attachment pads on said cube mounting surface of said interposer, whereby said functioning chips provide the required output from the chip cube.

7. The structure as defined in claim 6 wherein said interposer is a laminated structure having different materials forming the laminate whereby to control the coefficient of thermal expansion.

8. The structure as defined in claim 7 wherein said laminate structure is a dielectric material having a metal sheet disposed therein.

* * * * *